United States Patent
Matsui et al.

[11] Patent Number: 5,825,309
[45] Date of Patent: Oct. 20, 1998

[54] DATA MODULATING METHOD AND MODULATING AND DEMODULATING APPARATUSES

[75] Inventors: Shinzo Matsui, Yamanashi-ken; Takeshi Mori, Machida, both of Japan

[73] Assignee: Olympus Optical Co., Ltd,, Tokyo, Japan

[21] Appl. No.: 696,003

[22] Filed: Aug. 12, 1996

[30] Foreign Application Priority Data

Aug. 21, 1995 [JP] Japan ................................ 7-212177

[51] Int. Cl.$^6$ ................................................ H04N 1/00
[52] U.S. Cl. ............................... 341/50; 371/37.1; 341/58
[58] Field of Search ............................ 341/50, 58, 59, 341/63, 68; 371/37.1

[56] References Cited

U.S. PATENT DOCUMENTS 4,688,205  8/1987  Abiko .......................................... 369/59
5,355,133  10/1994  Shimpuku et al. ....................... 341/58

FOREIGN PATENT DOCUMENTS 0 670 555 A1   9/1995   European Pat. Off. .

*Primary Examiner*—Jeffrey A. Gaffin
*Assistant Examiner*—Peguy Jeanpierre
*Attorney, Agent, or Firm*—Frishauf, Holtz, Goodman, Langer & Chick

[57] ABSTRACT

A modulating apparatus wherein input data is modulated in the case of recording code data, which can be read optically, on a recording medium, so that a number of consecutive bits of a predetermined value in the code data is less than a predetermined number of consecutive bits of the predetermined value in a reference mark (e.g., a marker in a dot code), in order to discriminate the code data from the reference mark. An 8–10 modulating apparatus for modulating 8-bit input data to 10-bit data comprises two 4–5 modulating units (memories) for converting 4-bit input data to 5-bit data. And a 10–8 demodulating apparatus for demodulating 10-bit input data to 8-bit data comprises two 5–4 demodulating units for converting 5-bit input data to 4-bit data.

15 Claims, 9 Drawing Sheets

```
             ADDEND         SUBTRAHEND
DATA  1  00000000  0               0  0000000000
      2  00000001  0               0  0000000001
      3  00000010  0               0  0000000010
      4  00000011  0  MODULA-      0  0000000011
      5  00000100  0  TION         0  0000000100
      6  00000101  0     ──→       0  0000000101
      7  00000110  0               0  0000000110
      8  00000111  1   ←---        1  0000001000
      9  00001000  1  DEMODU-      1  0000001001
     10  00001001  1  LATION       1  0000001010
     11  00001010  1               1  0000001011
     12  00001011  1               1  0000001100
     13  00001100  1               1  0000001101
     14  00001101  3               3  0000010000
     15  00001110  3               3  0000010001
     16  00001111  3               3  0000010010
     17  00010000  3               3  0000010011
```

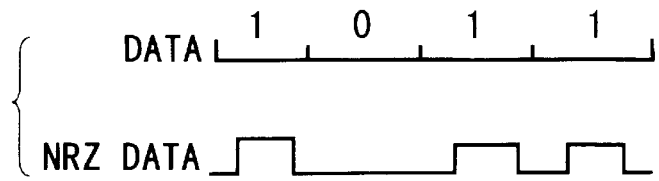
FIG. 1
(PRIOR ART)
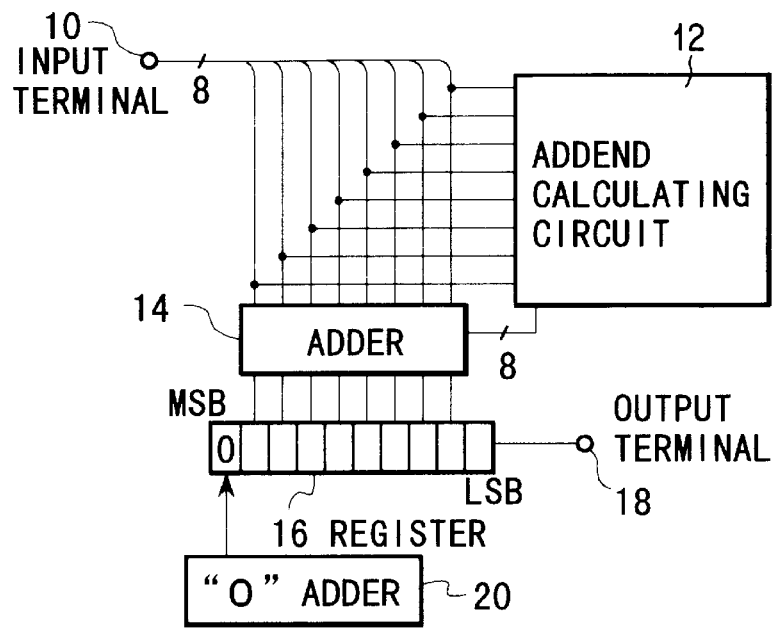
FIG. 3
FIG. 4

FIG. 8
```
      ADDEND        SUBTRAHEND
    0 0 0 0  0    0 0 0 0 0  0
    0 0 0 1  0 →  0 0 0 0 1  0
    0 0 1 0  0    0 0 0 1 0  0
    0 0 1 1  1 ←- 0 0 1 0 0  1
    0 1 0 0  1    0 0 1 0 1  1
    0 1 0 1  1    0 0 1 1 0  1
    0 1 1 0  1    0 1 0 0 0  1
    0 1 1 1  2    0 1 0 0 1  2
    1 0 0 0  2    0 1 0 1 0  2
    1 0 0 1  3    0 1 1 0 0  3
    1 0 1 0  3    0 1 1 0 1  3
    1 0 1 1  5    1 0 0 0 0  5
    1 1 0 0  5    1 0 0 0 1  5
    1 1 0 1  5    1 0 0 1 0  5
    1 1 1 0  6    1 0 1 0 0  6
    1 1 1 1  6    1 0 1 0 1  6
```
FIG. 9
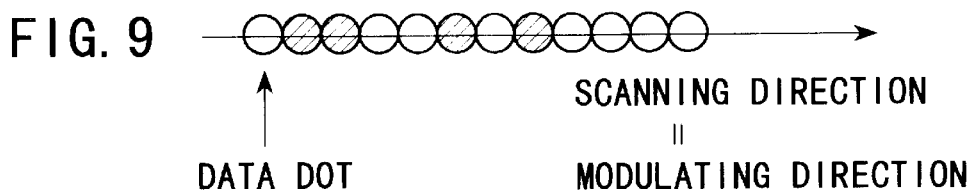
↑
DATA DOT
SCANNING DIRECTION
‖
MODULATING DIRECTION
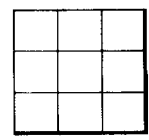
1 PATTERN
FIG. 10A
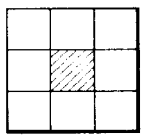
9 PATTERNS
FIG. 10B
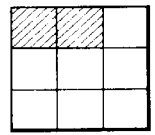
36 PATTERNS
FIG. 10C
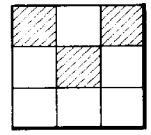
78 PATTERNS
FIG. 10D
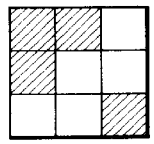
90 PATTERNS
FIG. 10E
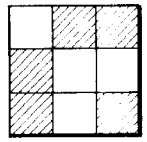
45 PATTERNS
FIG. 10F
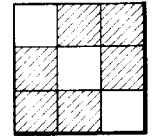
6 PATTERNS
FIG. 10G

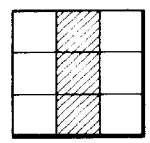
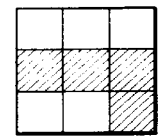
FIG. 11A          FIG. 11B
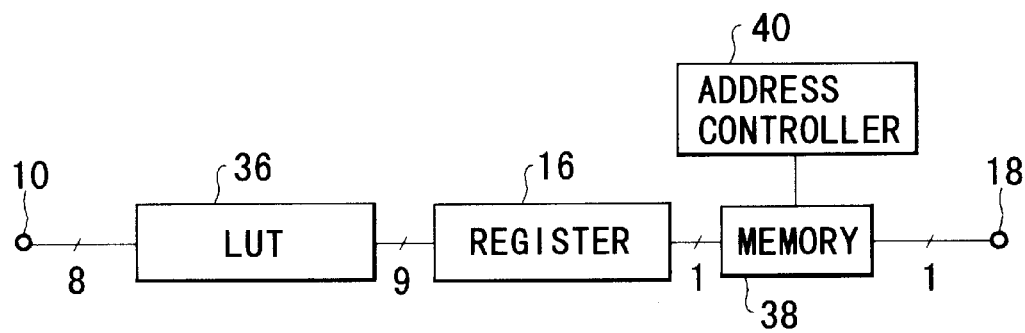
FIG. 12
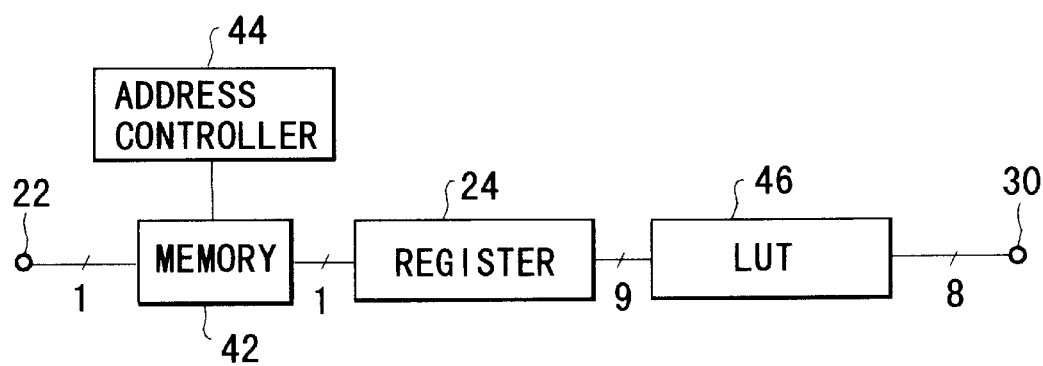
FIG. 13

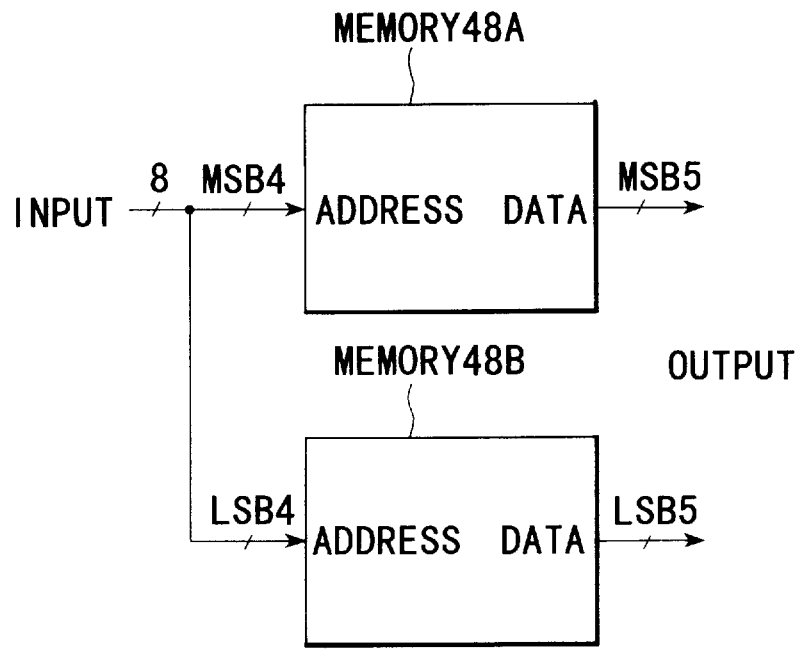
F I G. 14
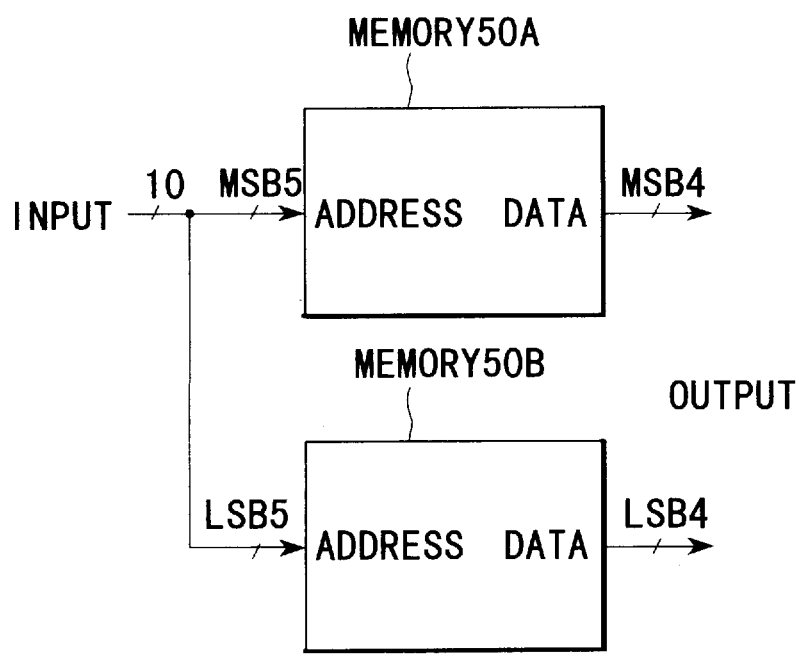
F I G. 17

| MODULATION DATA (DEC) | MODULATION DATA | INPUT DATA | INPUT DATA (DEC) | SELECTABLE/ UNSELECTABLE |
|---|---|---|---|---|
| 0  | 00000 | 00000 | 0  | O |
| 1  | 00001 | 00001 | 1  | O |
| 2  | 00010 | 00010 | 2  | O |
| 3  | 00011 | ×     |    | × |
| 4  | 00100 | 00100 | 4  | O |
| 5  | 00101 | 00101 | 5  | O |
| 6  | 00110 | 00110 | 6  | O |
| 7  | 00111 | ×     |    | × |
| 8  | 01000 | 01000 | 8  | O |
| 9  | 01001 | 01001 | 9  | O |
| 10 | 01010 | 01010 | 10 | O |
| 11 | 01011 | ×     |    | × |
| 12 | 01100 | 01100 | 12 | O |
| 13 | 01101 | 01101 | 13 | O |
| 14 | 01110 | ×     |    | × |
| 15 | 01111 | ×     |    | × |
| 16 | 10000 | 01111 | 15 | O |
| 17 | 10001 | 01110 | 14 | O |
| 18 | 10010 | 00011 | 3  | O |
| 19 | 10011 | ×     |    | × |
| 20 | 10100 | 01011 | 11 | O |
| 21 | 10101 |       | -  | O |
| 22 | 10110 | 00111 | 7  | O |
| 23 | 10111 | ×     |    | × |
| 24 | 11000 | ×     |    | × |
| 25 | 11001 | ×     |    | × |
| 26 | 11010 | ×     |    | × |
| 27 | 11011 | ×     |    | × |
| 28 | 11100 | ×     |    | × |
| 29 | 11101 | ×     |    | × |
| 30 | 11110 | ×     |    | × |
| 31 | 11111 | ×     |    | × |

F I G. 15

| P-Q MODULATION | NUMBER OF DATA | NUMBER OF SELECTABLE MODULATION DATA | REDUN-DANCY [%] | MEMORY CAPACITY (AMOUNT OF CIRCUITS) |
|---|---|---|---|---|
| 1-2MODULATION | 2 | 3 | 50 | 2 |
| 2-3MODULATION | 4 | 5 | 33 | 12 |
| 3-4MODULATION | 8 | 9 | 25 | 32 |
| 4-5MODULATION | 16 | 17 | 20 | 80 |
| 5-6MODULATION | 32 | 31 | 17 | 192 |

DATA MODULATING METHOD AND MODULATING AND DEMODULATING APPARATUSES

BACKGROUND OF THE INVENTION

1. Field of the Invention

The present invention relates to a data modulating method, and data modulating and demodulating apparatuses.

2. Description of the Related Art

Various methods for modulating and recording data, suitable for different types of recording mediums, have been developed.

One of the systems is an NRZ (non return to zero) modulation. In the NRZ modulation, as shown in FIG. 1, data is modulated to a waveform whose polarity is changed when the level of digital data is high. In this case, if data of low level "0" continues, the modulated data are also consecutively "0". Actually, however, the consecutiveness of "0" level data is limited, so that a self-clock can easily be performed on a reproducing side.

EP 0 670 555 A1 (corresponding to U.S. patent application Ser. No. 08/407,018, assigned to the same assignee as the present application), discloses an apparatus for recording a dot code including data dots on a paper sheet or the like and reproducing the dot code. The dot code used in the apparatus is modulated. The rule of the modulation is to convert data to a pattern which does not exist in a marker (consecutive blacks on a paper sheet). If the marker is formed of blacks, data can include consecutive whites. This is different from the aforementioned NRZ modulation. In this modulation, a self-clock operation is not performed, and only data sample positions are obtained on the basis of the marker when data is to be read.

The dot code has a format as shown in FIG. 2. As shown in FIG. 2A, a block 172 includes a marker 174, a block address 176, address error detection/correction data 178 and a data area 180 in which data is actually recorded. A number of blocks 172 are two-dimensionally arranged in columns and rows (FIG. 2), thereby forming code data, i.e., a dot code 170 (FIG. 2B). The marker 174 is a black circle having a diameter corresponding to seven dots (seven data dots). A dot 171 of FIG. 2A is shown enlarged in FIG. 2C.

In the conventional modulating system, since the cycle synchronization is determined, modulation does not have a degree of freedom, and redundancy for modulation is increased.

SUMMARY OF THE INVENTION

The present invention has been made in consideration of the above circumstances, and an object of the present invention is to provide a modulating method with little redundancy, adapted for recording code data on a recording medium.

Another object of the present invention is to provide modulating and demodulating apparatuses using a small amount of circuitry at a low cost when they are realized by circuits, or using a less amount of memory when realized by software.

According to the present invention, there is provided a modulating apparatus for converting input data of N bits to data of M bits (M>N+1: M and N are integers), comprising:

means for dividing the input data of N bits to input data of an n-number ($n \geq 2$) of Pi bits (N=P1+P2+ . . . +Pn: Pi is an integer); and an n-number of modulating units (48A, 48B) for converting the divided input data of Pi bit to data of Qi bits (M=Q1+Q2+ . . . +Qn: Qi is an integer: $Qi \geq Pi+1$).

In the above modulating apparatus, the input data is modulated in case of recording code data, which can be read optically, on a recording medium, so that a number of consecutive bits of a predetermined value in the code data is less than a predetermined number of consecutive bits of the predetermined value in a reference mark, in order to discriminate the code data from the reference mark, the reference mark serving as a reference for reading the code data and having the predetermined number of consecutive bits of the predetermined value.

For example, if a marker serving as a reference for reading dot codes as code data is formed of consecutive bits of a predetermined data value, e.g., blacks, the code data is modulated such that all the consecutive whites in the code data are allowed, while the number of consecutive blacks is limited. More specifically, the number of consecutive blacks in the code data is limited under the number of the blacks constituting the marker. On the other hand, if the marker is formed of consecutive whites, all the consecutive blacks in the code data are allowed.

In other words, according to the present invention, there is provided a modulating apparatus in which the number of consecutive blacks in the code data is less than three to discriminate the code data from the consecutive blacks (the marker) including at least three consecutive blacks recorded on a recording medium (paper sheet). The modulating apparatus for converting 8-bit input data to 10-bit data comprises two modulating units for converting 4-bit input data to 5-bit data. In this case, each modulating unit converts data so that the number of consecutive blacks in the data is two or less.

As a result, the code data recorded by the modulating apparatus for converting 8-bit input data to 10-bit data can be optically read, so that the reference mark including three consecutive blacks can be discriminated from data including two or less consecutive blacks.

In a case where the modulating unit for converting 4-bit input data to 5-bit data is formed of a memory, the memory requires 4 address bits and 5 data bits and a 80-bit memory capacity. Since the modulating apparatus for converting 8-bit input data to 10-bit data has two modulating units of this type, a 160-bit memory capacity is required. In contrast, according to the modulating apparatus for converting 8-bit input data to 10-bit data by means of one memory requires a memory capacity of 2560 bits. Thus, the former requires a memory capacity 1/16 that of the latter, less cost and less circuit space.

According to the present invention, there is also provided a demodulating apparatus for converting input data of M bits to data of N bits (M>N+1: M and N are integers), comprising:

means for dividing the input data of M bits to input data of an n-number ($n \geq 2$) of Qi bits (M=Q1+Q2+ . . . +Qn: Qi is an integer); and an n-number of demodulating units (50A, 50B) for converting the divided input data of Qi bit to data of Pi bits (N=P1+P2+ . . . +Pn: Pi is an integer: $Qi \geq Pi+1$).

Like the aforementioned modulating apparatus of the present invention, by using two demodulating units for converting 5-bit input data to 4-bit data, the demodulating apparatus for converting 10-bit input data to 8-bit data may require a less amount of circuitry and memory capacity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a diagram for explaining an NRZ (non return to zero modulation) which is a representative conventional modulating method;

FIG. 2 and FIGS. 2A–2C are diagrams showing a format of a dot code disclosed in EP 0 670 555 A1;

FIG. 3 is a diagram showing a structure of a modulating apparatus for executing a modulating method according to a first embodiment of the present invention;

FIG. 4 is a diagram for explaining a method for calculating a coefficient in an addend calculating circuit and a subtrahend calculating circuit;

FIG. 8 is a diagram for explaining a modulating method according to a second embodiment of the present invention;

FIG. 9 is a diagram for explaining the relationship between the direction of one-dimensional modulation and the direction of data scanning;

FIGS. 10A to 10G are diagrams showing examples, in which 8-bit data is modulated to a 3×3 unit block, to explain a modulating method according to a third embodiment of the present invention;

FIGS. 11A and 11B are diagrams showing patterns allowable in the third embodiment;

FIG. 12 is a diagram showing a modulating apparatus for executing two-dimensional modulation of the 3×3 unit blocks according to the third embodiment;

FIG. 13 is a diagram showing a demodulating apparatus for executing two-dimensional modulation of the 3×3 unit blocks according to the third embodiment;

FIG. 14 is a diagram showing a structure of an 8–10 modulating apparatus according to a fourth embodiment of the present invention (modulation for converting input data of N bits to data of M bits is referred to as N-M modulation);

FIG. 15 is a diagram showing a 4–5 modulation table;

FIG. 17 is a diagram showing a structure of a 10–8 demodulating apparatus according to the fourth embodiment of the present invention (demodulation for converting input data of M bits to data of N bits is referred to as M-N demodulation);

DETAILED DESCRIPTION OF THE PREFERRED EMBODIMENTS

Figure 2:
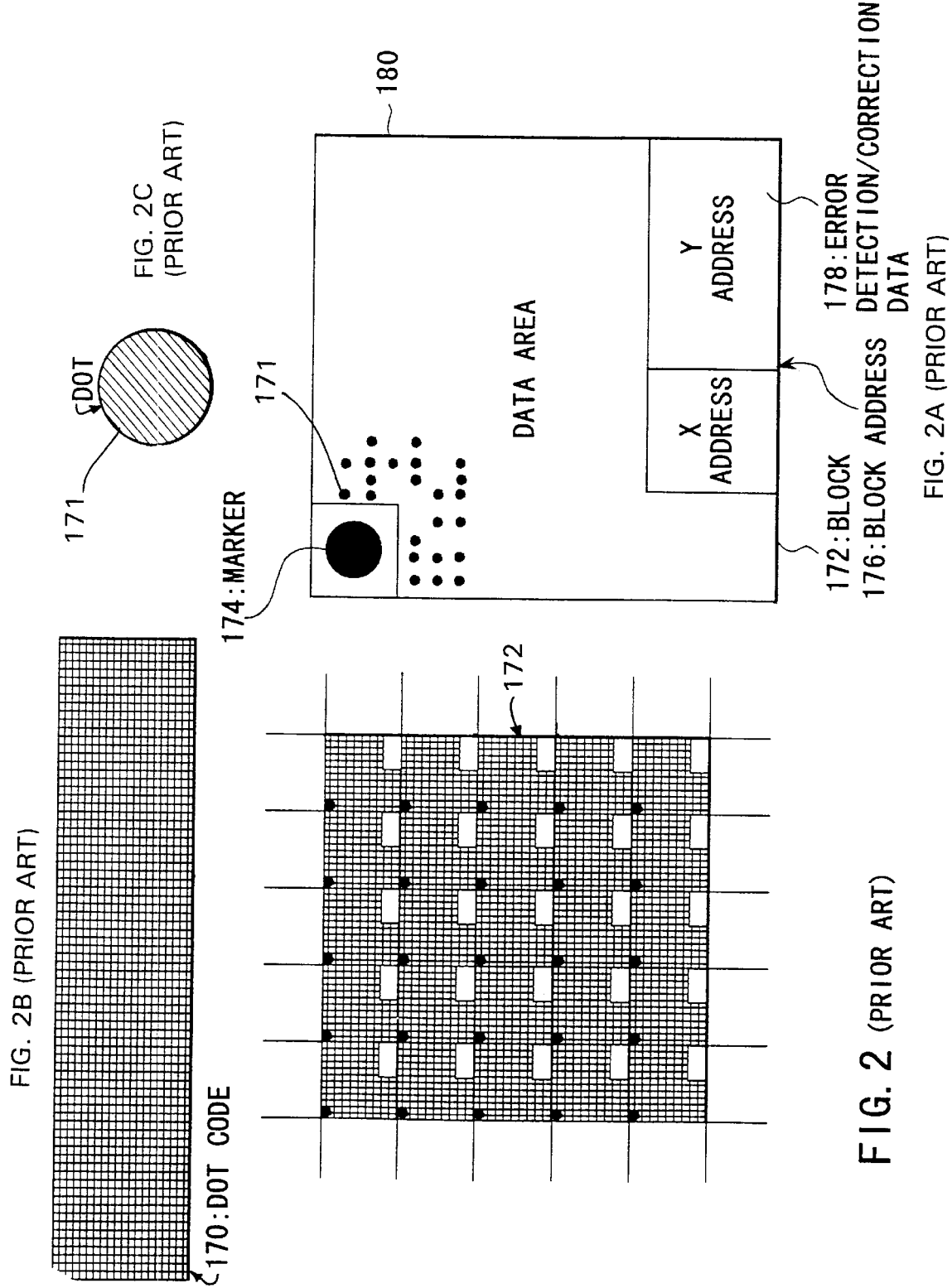

Embodiments of the present invention will be described with reference to the accompanying drawings.

[First Embodiment]

FIG. 3 is a diagram showing a structure of a modulating apparatus for executing a modulating method according to a first embodiment of the present invention. In this embodiment, data of 8 bits is converted to data of 10 bits to be discriminated from a marker 174 serving as a reference mark. The number of consecutive blacks (digital data "1") is limited to two or less and one-dimensional modulation is executed.

First, digital data is input through an input terminal 10. An addend calculating circuit 12 calculates a coefficient to be added from the input data. An adder 14 adds the calculated coefficient to the data originally input. A register 16 parallel-to-serial converts data of the addition result and supplies it to an output terminal 18. At this time, a "0" adder circuit 20 adds "0" to the most significant bit (hereinafter abbreviated as MSB) of the converted data. Therefore, even if the data in the next bit is "1", two "1" bits will not adjoin.

A method for calculating a coefficient (a number to be added) in the addend calculating circuit 12 will be described with reference to FIG. 4.

Assume that counter signals, incremented one by one from "data 1" of all the bits "0", are input through the input terminal 10. Since "data 8" has three consecutive bits of the value "1", the addend calculating circuit 12 outputs data "00000001", i.e., "1", thereby eliminating a number having three consecutive "1" bits. The addend calculating circuit 12 outputs data "00000001" with respect to "data 8" to "data 13", so that output data may not have three consecutive "1" bits and may not be the same as the preceding data. It outputs data "00000011", i.e., "3", when "data 14" is input. If "00000001" is added to "00001101" (data 14), the addition results in "00001110", which includes three consecutive "1" bits. To prevent three consecutive "1" bits, the output data should be "0000010000". The addend cannot be "2", since, if "2" is added, the addition result still contains three consecutive "1" bits. Input data is modulated in accordance with the above-described calculation method.

A calculation method in the case of demodulation is reverse to that in the case of the modulation. A subtrahend calculating circuit calculates how many pieces of data there are in the input data and outputs coefficients to be subtracted (subtrahends). For example, if input data is "0000010000", there are three pieces of data which is smaller than the input data and contain at least three consecutive "1" bits: "0000000111", "0000001110" and "0000001111". Since the three pieces of data have been excluded in the modulation for the reason stated above, the coefficient "00000011" corresponding to "3" is output as a subtrahend, taking the three pieces of data into account in the demodulation.

Figure 5:
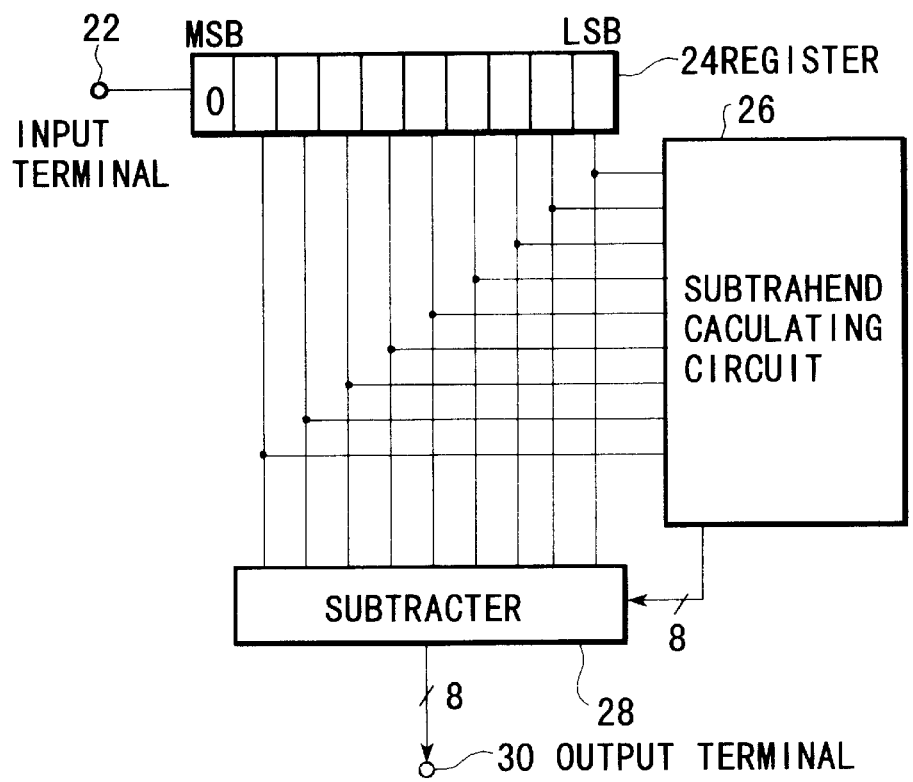
FIG. 5 is a diagram showing a structure of a demodulating apparatus according to the first embodiment.

A demodulation apparatus will be described with reference to FIG. 5.

Data of 10 bits is input through an input terminal 22 of the demodulation apparatus and serial-to-parallel converted by a register 24. At this time, the MSB (Most Significant Bit)

should be "0". If the MSB is "1", this may be judged to be an error and the MSB can be corrected to "0". The lower 9 bits are supplied to a subtrahend calculating circuit 26, which calculates and outputs a coefficient based on the aforementioned calculating method. At the same time, a subtracter 28 subtracts the coefficient from the input data. As a result, 8-bit data is output through an output terminal 30.

The addend calculating circuit 12 and the subtrahend calculating circuit 26 may be formed of ROMs. Further, although a "0" bit is added to the MSB to avoid consecutive "1" bits, it is possible to add a "0" bit to the least significant bit (hereinafter abbreviated as LSB).

Figure 6:
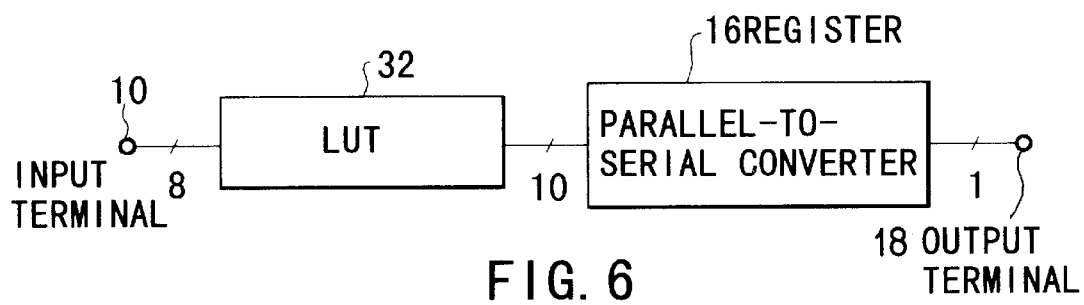
FIG. 6 is a diagram showing another structure of the modulating apparatus for executing the modulating method according to the first embodiment.
Figure 7:
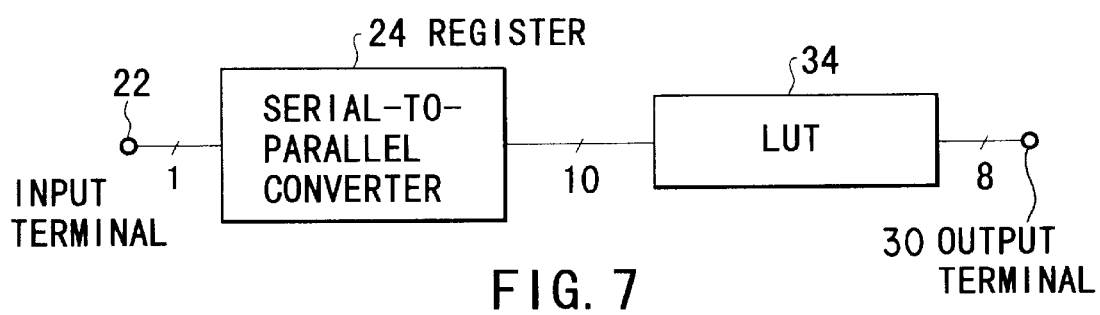
FIG. 7 is a diagram showing another structure of the demodulating apparatus for executing the modulating method according to the first embodiment.

The modulating apparatus and the demodulating apparatus can be constructed by use of a look up table (hereinafter abbreviated as LUT). FIG. 6 shows a modulating apparatus and FIG. 7 shows a demodulating apparatus. In FIGS. 6 and 7, numerals 1, 8 and 10 denote the numbers of bits on the respective lines. In the modulating apparatus, 8-bit data is input through an input terminal 10 and modulated by a LUT 32. The modulated digital data is parallel-to-serial converted by a register 16 and output through an output terminal 18. In the demodulating apparatus, serial data is input through an input terminal 22 and serial-to-parallel converted by a register 24 to parallel data, which is demodulated by a LUT 34 to 8-bit data and output through an output terminal 30.

In the case where the modulating and demodulating apparatuses are constructed by use of LUTs, data can be modulated on the basis of the rule shown in FIG. 4, or any other rules, even without any rule. In this case, all the 8-bit input data must be converted to 10-bit output data, which are different from one another. In this embodiment, the number of consecutive blacks is limited to two or less; however, it can be any number, so long as the dots is discriminated from the marker 174. It is preferable that the number of consecutive blacks of data be ½ or less than the number of blacks constituting the marker, so that the dots of data can be detected more easily.

The 8–10 modulation has been described above; however, 8–9 modulation is also possible, if at most three consecutive "1" bits are allowed. In the 8–9 modulation, the redundancy is reduced and a more amount of data can be input. In this case, the relation with adjacent data should be taken into consideration. For example, if the most significant two bits of 9-bit output are "00" or "10" and the least significant three bits are "000", "001", "010", "011", "100", "101" or "110", consecutive four "1" bits can be avoided. Such modulation is required.

[Second Embodiment]

A modulating method according to a second embodiment will be described.

In this embodiment, 4–5 modulation is performed. More specifically, 4-bit input data is converted to 5-bit output data and two consecutive "1" bits are allowed. The circuit configuration is the same as those shown in FIGS. 3 and 5, although the number of bits is different therefrom.

Taking the relation with values of adjacent data into consideration, data is modulated under the following conditions: the most significant two bits of the modulated data are limited to "00", "10" or "01", and the least significant two bits cannot be "11". The coefficient (addend) in the addend calculating circuit 12 shown in FIG. 3 and the output (subtrahend) from the subtrahend calculating circuit 26 shown in FIG. 6 are as shown in FIG. 8.

In the case where the circuits of the second embodiment are constructed with LUTs, data can be table-converted on the basis of the rule shown in FIG. 8. Besides the modulated data shown in FIG. 8, data "10110" also satisfies the above conditions. It is therefore possible to incorporate the data "10110" into the modulated data.

By the 4–5 modulation as described above, if an error in one bit occurs, the range of the influence of the error is restricted within a 4-bit output from the demodulating apparatus. Thus, the error influence range can be reduced as compared to the 8–10 modulation or the 8–9 modulation.

In both the first and second embodiments, since one-dimensional modulation is performed, it is preferable that the data scanning direction coincides with the modulating direction. If the modulating direction is perpendicular to the data scanning direction, a number of consecutive "1" bits, other than the marker 174, can be detected simply by scanning, and therefore, the marker cannot easily be detected without scanning conversion.

[Third Embodiment]

A third embodiment, in which two-dimensional modulation is performed, will now be described. By the two-dimensional modulation, the number of consecutive "1" bits can be suppressed to 4 or less in whatever direction data is scanned. Thus, the third embodiment is advantageous in that, even if data is scanned in the direction perpendicular to the preferable direction, the marker 174 serving as a reference mark can be detected.

FIGS. 10A to 10G show examples, in which 8-bit data is modulated to a 3×3 unit block. This is 8–9 modulation.

There is only one case in which all the dots have the value "0", as shown in FIG. 10A. FIG. 10B shows a case in which one dot of the unit block has the value "1". FIGS. 10C to 10G respectively show cases in which two dots, three dots, four dots, five dots and six dots have the value "1".

The dots of the value "1" are arranged in accordance with the rule that three "1" dots cannot exist on a horizontal or vertical line. The case of FIG. 10A has 1 pattern, the case of FIG. 10B has 9 patterns, the case of FIG. 10C has 36 patterns, the case of FIG. 10D has 78 patterns, the case of FIG. 10E has 90 patterns, the case of FIG. 10F has 45 patterns and the case of FIG. 10G has 6 patterns. The total number of patterns are:

$$1+9+36+78+90+45+6=256.$$

It is theoretically possible to express 256 tones. A pattern having a high density of the value "1", or a pattern which may become similar to the marker in association with an adjacent unit block, can be excluded from the 256 patterns.

In this embodiment, the dots of the value "1" are arranged two-dimensionally in accordance with the rule that three "1" dots cannot exist on a horizontal or vertical line. However, to prevent a group of the value "1" in association with a dot of an adjacent unit block, patterns as shown in FIGS. 11A and 11B may also be allowed. The rule of modulation can be determined depending on printing conditions and the like.

Although the 3×3 block is used as a unit in this embodiment, it is possible to use a 4×4 unit block to perform 15–16 modulation. The modulation method can be modified variously within the scope of the invention.

FIGS. 12 and 13 show a modulation apparatus and demodulation apparatus for use in two-dimensional modulation of the 3×3 unit block.

In the modulation apparatus, input data through an input terminal 10 is modulated by a LUT 36 and parallel-to-serial converted by a register 16. An output from the register 16 is input to a memory 38 and a unit block is formed by controlling an address to write data in the memory 38 by means of an address controller 40. Data in a form of the unit block is output through an output terminal 18 in a style suitable for arrangement on a paper sheet. Thus, the modulation is completed.

In the demodulation apparatus, data is input through an input terminal 22 to a memory 42, and data in the form of a unit block is output under control of an address controller 44. The output data is serial-to-parallel converted by a register 24, and the converted data is demodulated by a LUT 46 and output through an output terminal 30.

By virtue of the two-dimensional modulation as described above, the scanning direction is not limited and data can be scanned easily.

[Fourth Embodiment]

FIG. 14 shows a modulating apparatus according to a fourth embodiment of the present invention. In this embodiment, 8–10 modulation is performed one-dimensionally, so that data can be discriminated from a marker serving as a reference mark, under the condition that the number of consecutive blacks (digital data "1") is limited to two or less.

The modulating apparatus for performing 8–10 modulation comprises two modulating units for converting 4-bit input data to 5-bit data. The two modulating units correspond to the aforementioned LUT and formed of, e.g., memories 48A and 48B as shown in FIG. 14.

The 8–10 modulating apparatus operates as follows. When 8-bit data is input, the values of the upper 4 bits of the 8-bit input data are input to address pins of the memory 48A, and the values of the upper 5 bits of converted 10-bit modulation data are output through data pins of the memory 48A. The values of the lower 4 bits of the 8-bit input data are input to address pins of the memory 48B, and the values of the lower 5 bits of the converted 10-bit modulation data are output through data pins of the memory 48B.

FIG. 15 shows a 4–5 modulation table used in the memories 48A and 48B.

The first column of the 4–5 modulation table denotes decimal number candidates (DEC) for modulation data which can be expressed by 5-bit outputs. The second column denotes binary numbers corresponding to the decimal numbers. In the fifth column, selectable data, which satisfies the condition that the number of consecutive digital data "1" is two or less, is represented by a mark ○, and unselectable data, which does not, is represented by a mark x. In the fourth column, 16 modulation data, which can be easily constructed by a circuit, are selected from the data represented by the mark ○ and assigned to input data in one-to-one correspondence. The third column denotes binary numbers corresponding to the numbers in the fourth column. The method of assigning input data to the 16 modulation data in one-to-one correspondence need not be the same as shown in the table. The assigning method will be described in detail later.

An arrangement of modulation data on a paper sheet will be described with reference to FIG. 16.

Figure 16:
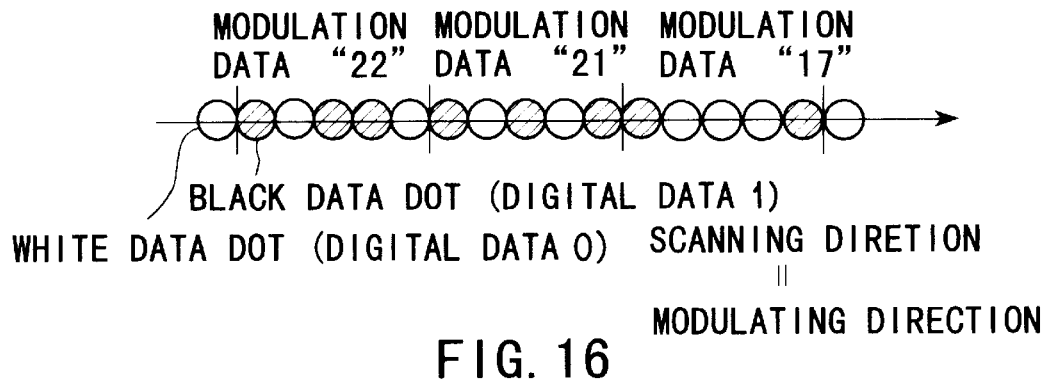
FIG. 16 is a diagram showing an arrangement of modulation data on a paper sheet.

In FIG. 16, five circles partitioned by vertical lines (drawn for convenience of explanation) are data dots. A black data dot represents the value "1" and a white data dot represents the value "0". The arrow indicates the scanning direction in reproduction, which is the modulating direction.

In this drawing, modulation data "22", "21" and "17" in the 4–5 modulation table shown in FIG. 15 are arranged. The arrangement of the data dots satisfies the above modulating condition that the number of consecutive digital data "1" is two or less.

Selection of data, which satisfy the modulating condition from the 4–5 modulation table, will now be described.

In the 4–5 modulation, the total number of pieces of input data is 16, because the number of bits of input data is 4. The number of pieces of output data, which can be represented by 5 bits, is 32. However, since the modulation data "31" in the 4–5 modulation table of FIG. 15 is "11111" in binary notation (five consecutive "1" bits), it does not satisfy the above modulating condition.

16 data are selected from the 32 data which can be represented by 5 bits, such that the above modulating conditions can be satisfied even in the case where a plurality of 5-bit modulation data are arranged in the modulating direction, as shown in FIG. 16.

The data are selected under the following conditions:
1. The lower two bits of the data are not "11".
2. The upper two bits of the data are not "11".
3. The data does not include "111" in the bits.

The modulation data, represented by the mark ○ in the fifth column (selectable/unselectable) of the 4–5 modulation table, satisfy the above three selecting conditions. Even when the selected data are adjoined, the number of consecutive "1" bits is two or less. The number of selectable modulation data is 17, which is greater than 16, the necessary number of pieces of data to be selected. Therefore, a modulating unit which satisfies the above modulating condition can be realized by the 4–5 modulation.

Accordingly, the 8–10 modulating apparatus, constituted by the two 4–5 modulating units which satisfy the modulating condition, also satisfies the modulating condition.

Each of the memories 48A and 48B of this embodiment has 4 address bits and 5 data bits, and the memory capacity thereof is 24x5=80 bits. The memory capacity of the overall 8–10 modulating apparatus shown in FIG. 14 is 160 bits, which is 1/16 the memory capacity 2560 bits of the LUT of an 8–10 modulating apparatus having one memory. Thus, it is clear that the amount of memories, i.e., circuits, is less than the case of the 8–10 modulating apparatus having one memory. Further, if the LUT is formed of logical circuits, such as gate arrays, the number of gates is 300 to 1000, which is less than that of the above case. Moreover, if the LUT is realized by software, the modulation table can be formed of 80 bits, equal to the bits of one 4–5 modulation table, and less than the memory capacity of the 8–10 modulation table.

FIG. 17 shows a demodulating apparatus according to the fourth embodiment of the present invention. The demodulating apparatus reproduces code data recorded by the modulating apparatus described above. In this embodiment, 10–8 demodulation is performed one-dimensionally to convert the modulated data to the original data.

The demodulating apparatus comprises two demodulating units for converting 5-bit input data to 4-bit data. The two demodulating units correspond to the aforementioned LUT and formed of, e.g., memories 50A and 50B as shown in FIG. 17.

The 10–8 demodulating apparatus operates as follows. When 10-bit data is input, the values of the upper 5 bits of the 10-bit input data are input to address pins of the memory 50A, and the values of the upper 4 bits of converted 8-bit modulation data are output through data pins of the memory 50A. The values of the lower 5 bits of the 10-bit input data are input to address pins of the memory 50B, and the values of the lower 4 bits of the converted 8-bit modulation data are output through data pins of the memory 50B.

Each of the memories 50A and 50B of this embodiment has 5 address bits and 4 data bits, and the memory capacity thereof is $2^5 \times 4 = 128$ bits. The memory capacity of the overall 10–8 modulating apparatus shown in FIG. 17 is therefore 256 bits, which is 1/16 the memory capacity 8192 bits of a 10–8 demodulating apparatus having one memory. Thus, the amount of memories, i.e., circuits, is less than the case of the 10–8 demodulating apparatus having one memory. Further, if the LUT is formed of logical circuits, such as gate arrays, the number of gates is 500 to 1000, which is less than that of the above case. Moreover, if the LUT is realized by software, the modulation (demodulation) table can be formed of 128 bits, equal to the bits of one 5–4 demodulation table, and the amount of circuitry can be reduced.

Figure 18:
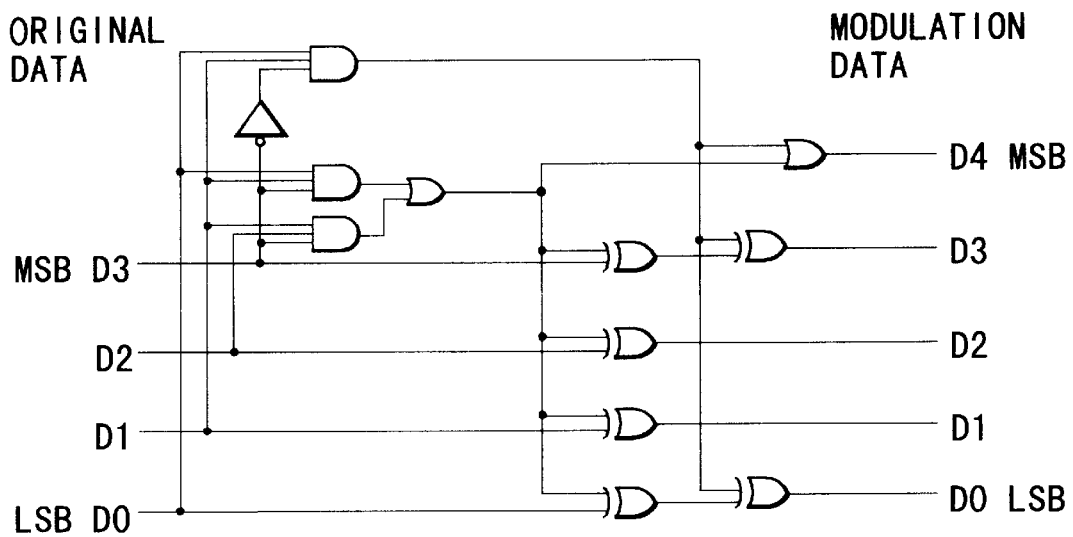
FIG. 18 is a diagram showing a structure of a 4–5 modulation processing unit formed of logical circuits such as gate arrays.
Figure 19:
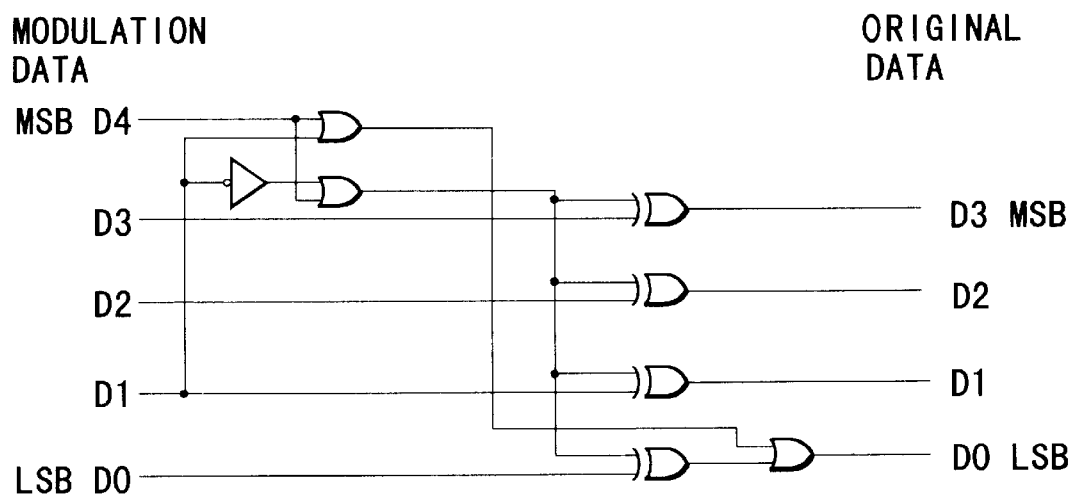
FIG. 19 is a diagram showing a structure of a 5–4 demodulation processing unit formed of logical circuits such as gate arrays.

A case in which the modulation table shown in FIG. 15 is efficiently constituted by logical circuits will be described. FIG. 18 shows the structure of a 4–5 modulating unit and FIG. 19 shows the structure of a 5–4 demodulating unit.

First, the demodulating unit shown in FIG. 19 will be described.

Modulated data of 5 bits D0, D1, D2, D3 and D4 is input to the demodulating unit. D4 is the most significant bit (MSB) of the modulation data. Data of 4 bits D0, D1, D2 and D3 is output therefrom as demodulated data (input data in a case of modulation). D3 is the most significant bit (MSB) of the demodulated data. As shown in FIG. 19, the demodulating unit is constituted by logical circuits of two ANDs, one NOT, four XORs and one OR. Input data is converted to output data by the logical circuits between the bits.

The modulation table shown in FIG. 15 is a result of selecting modulation data to realize an efficient circuit. In this embodiment, the data are selected in the following procedures:

A first procedure is to select modulation data in which the MSB is "0" and the lower 4 bits are the same as those of input data.

A second procedure is to select modulation data in which the MSB is "1" and inversion of the lower 4 bits are the same as the lower 4 bits of input data.

A third procedure is to select modulation data in which the MSB is "1" and data obtained by inverting one of the lower 4 bits are the same as the lower 4 bits of the input data.

As a result of the first to third procedures, the modulation table as shown in FIG. 15 is obtained. Taking the above procedures into account, an efficient demodulating unit as shown in FIG. 19 is realized. In this case, the number of gates is about 20, which is less than that in the case where the demodulating unit is formed of a memory.

The logic as shown in FIG. 19 can be executed by a software process using logical instructions such as AND, NOT, XOR, and OR by a computer constituted by a CPU, a ROM in which programs and modulation data are restored, a RAM serving as a work memory for storing intermediate data of the process, an input port for receiving input data, and an output port for outputting demodulated data. In this case, since the logical calculation is reduced, the process can be executed at higher speed and no memory is required. As a result, the circuit is simplified.

The modulating unit shown in FIG. 18 will now be described.

Data of 4 bits D0, D1, D2 and D3 is input to the modulating unit. D3 is the most significant bit (MSB) of the modulation data. Data of 5 bits D0, D1, D2, D3 and D4 is output therefrom as modulated data. D4 is the most significant bit (MSB) of the demodulated data. As shown in FIG. 18, the demodulating unit is constituted by logical circuits of three ANDs, one NOT, six XORs and two ORs. Input data is converted to output data by the logical circuits between the bits.

The circuit shown in FIG. 18 is constructed taking into account that the arrangement of the input data is the same as that of the output data (modulation data) like the demodulating unit described above. Thus, an efficient modulating unit is realized. In this case, the number of gates is about 30, which is less than that in the case where the modulating unit is formed of a memory.

The 8–10 modulation (the 10–8 demodulation) as described above can be realized by means other than the 4–5 modulation (the 5–4 demodulation).

More specifically, N-M modulation (M>N+1: M and N are integers) can be realized by using an n-number ($n \geq 2$) of modulating units for performing Pi-Qi modulation (where N=P1+P2+ . . . Pn: Pi is an integer, and M=Q1+Q2+ . . . Qn: Qi is an integer: $Qi \geq Pi+1$).

Figures 20, 21:
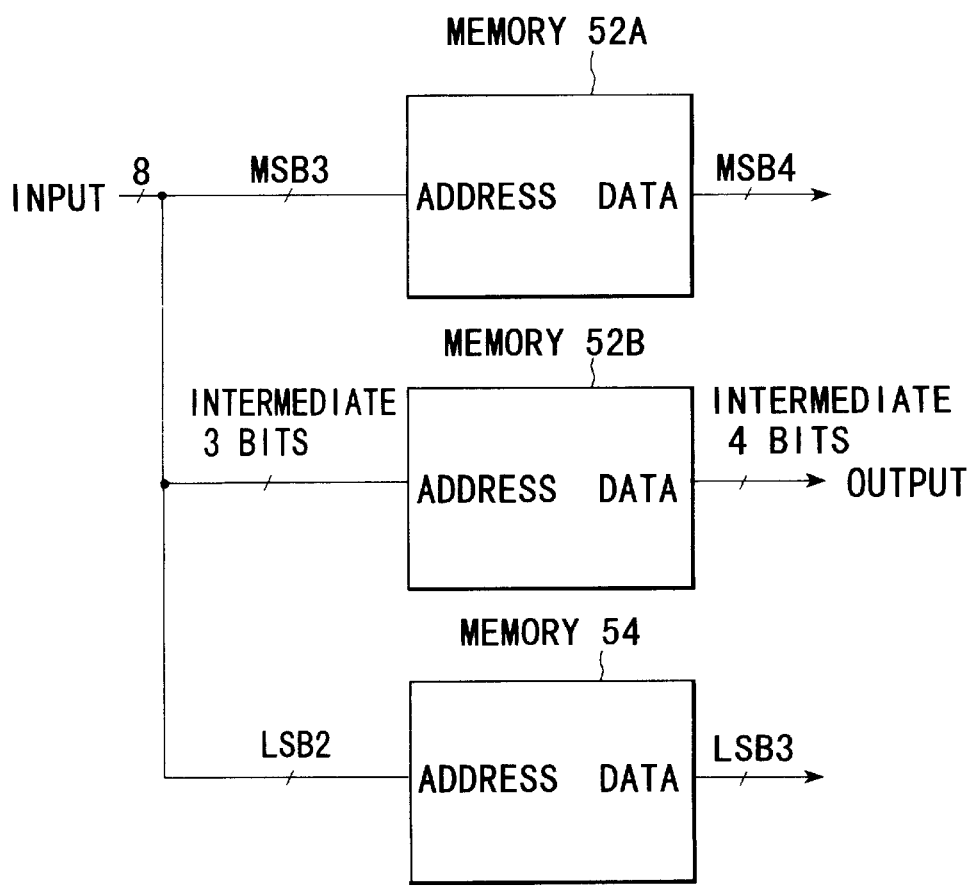
FIG. 20 is a table showing a list of P-Q modulation.
FIG. 21 is a diagram showing a structure of an 8–11 modulating apparatus according to a fifth embodiment of the present invention.

FIG. 20 shows a list of P-Q modulation units which can be used to realize 8–10 modulation.

In the table, the first column denotes the type of modulation (variations of P and Q); 1–2 modulation to 5–6 modulation. The table shows a case in which Q=P+1 ($Q \geq P+2$ is not employed, since the redundancy is increased). The second column denotes the number of pieces of input data. The third column denotes the number of pieces of selectable modulation data which satisfy the modulating condition described before. When the number of pieces of selectable modulation data is greater than the number of pieces of data, the modulation satisfies the modulating condition. In the table, the modulating condition is satisfied when P is 4 or smaller, and not satisfied when P is 5 or greater. The fourth column denotes the redundancy of information, which is calculated by the formula: the number of input data bits/the number of modulated data bits×100 [%]. The fifth column denotes the memory capacity (the number of bits), and the ratio of the numbers is the same as that of the amounts of circuits in the case where the modulation is executed by the logical circuits.

It is apparent from the table that the 4–5 modulation causes the least redundancy of those of all the 1–2, 2–3, 3–4 and 4–5 modulations. In other words, the 4–5 modulation is the best in terms of redundancy of the P-Q modulations (Q=P+1) which satisfy the aforementioned modulating conditions. Thus, since the 4–5 modulation causes the least redundancy and requires a small amount of circuitry (several tens of gates), it is most suitable to realize an 8–10 modulating apparatus.

Various types of data can be input for modulation; however, many of them are information of microcomputers and personal computers, and media information such as sound and images. As regards the number of bits of input data for modulation, information of the microcomputers and personal computers are treated by data of 4, 8, 16 or 32 bits (multiples of 4). Media information such as sound and image are treated by data 4, 8, 12 or 16 bits (multiples of 4). The 4–5 modulation is also preferable in this respect, since it is adapted for various information to be modulated.

[Fifth Embodiment]

A fifth embodiment of the present invention will be described.

FIG. 21 shows the structure of a modulating apparatus according to the fifth embodiment. The modulating apparatus performs N-M modulation (N=8, M=11), i.e., 8–11 modulation, and comprises a 2–3 modulating unit and two 3–4 modulating units.

The 3–4 modulating units are memories 52A and 52B, each having 3-bit address inputs and 4-bit data outputs. The 2–3 modulating unit is a memory 54 having 2-bit address inputs and 3-bits address outputs.

The 8–11 modulating apparatus operates as follows. When 8-bit data is input, the values of the upper 3 bits of the 8-bit input data are input to address pins of the memory 52A, and the values of the upper 4 bits of converted 11-bit modulation data are output through data pins of the memory 52A. The values of the intermediate 3 bits are input to address pins of the memory 52B and the values of the intermediate 4 bits of the 11-bit modulation data are output through data pins of the memory 52B. The values of the lower 2 bits are input to address pins of the memory 54, and the values of the lower 3 bits of the 11-bit modulation data are output through data pins of the memory 54.

If the 8–11 modulating apparatus comprises only one memory, a memory capacity of 256*11=2816 bits is required. However, the fifth embodiment, as shown in FIG. 20, requires a memory capacity of only 32+32+12=76 bits, and the amount of circuitry can be reduced. If the modulating apparatus is constituted by logical circuits, the amount of circuitry can be further reduced. Moreover, if the modulation is executed by software, a small number of memories suffice as in the fourth embodiment.

The 8–11 modulation can be divided into 4–5 modulation and 4–6 modulation. In this case, the redundancy is the same as that in the aforementioned case of using a 2–3 modulating unit and two 3–4 modulating units. However, the total memory capacity is 80+96=176 bits, which is greater than that in the case of the combination of the 2–3 modulation and the 3–4 modulation. If the 4–6 modulating unit is divided into two 2–3 modulating units, the total memory capacity is 80+12+12=104, which is somewhat less than the case of the combination of the 4–5 modulation and the 4–6 modulation.

As described above, when the modulating unit is divided into a plurality of systems which satisfy the aforementioned modulating condition, the memory capacity and the amount of circuitry are reduced. When the modulation is executed by software, the memory capacity is reduced and the process speed can be increased.

In the modulating apparatus for converting input data of N bits to data of M bits (M>N+1: M and N are integers), the memory capacity of the modulating apparatus comprising an n-number of modulating units (n≧2) for converting input data of Pi bits to data of Qi bits is calculated by the formula:

$$2^{P1} \times Q1 + 2^{P2} \times Q2 + \ldots 2^{Pn} \times Qn$$

(where N=P1+P2+ . . . Pn: Pi is an integer, and M=Q1+Q2+ . . . Qn: Qi is an integer: Qi≧Pi+1).

A maximum number $N_{MAX}$ into which N-M modulation can be divided is equal to M-N. When the M-N modulation is divided into the maximum number $n_{MAX}$, all the Pi-Qi modulations satisfy the condition Qi=Pi+1. In other words, an N-M modulating system with a least amount of circuitry is the modulating apparatus having the (M-N) number of modulating units which satisfy the modulating condition and in which the value of $2^{P1} \times Q1 + 2^{P2} \times Q2 + \ldots 2^{Pn} \times Qn$ is the smallest.

If the number of consecutive predetermined data values is two or less, the modulating apparatus operated by a combination of 1–2 modulation, 2–3 modulation, 3–4 modulation and 4–5 modulation has a particularly small amount of circuitry.

The present invention is not limited to the embodiments as described above, but can be variously applied or modified within the scope of the gist of the invention.

The following is the gist of the present invention.

(1) A modulating apparatus for converting input data of N bits to data of M bits (M>N+1: M and N are integers), comprises:

means for dividing the input data of N bits to input data of an n-number (n≧2) of Pi bits (N=P1+P2+ . . . +Pn: Pi is an integer); and an n-number of modulating units for converting the divided input data of Pi bit to data of Qi bits (M=Q1+ Q2+ . . . +Qn: Qi is an integer: Qi≧Pi+1).

The modulating apparatus comprises a plurality of modulating units, each converting part of bits of the input data to part of bits of the output data. The input bits and the output bits of one unit are independent of those of another unit. Therefore, the memory capacity or the amount of circuitry of each of the modulating units is reduced, so that a compact modulating apparatus can be manufactured at low cost.

(2) The modulating apparatus as described in the above paragraph (1), wherein the modulating apparatus modulates the input data in case of recording code data, which can be read optically, on a recording medium, so that a number of consecutive bits of a predetermined value in the code data is less than a predetermined number of consecutive bits of the predetermined value in a reference mark, in order to discriminate the code data from the reference mark, the reference mark serving as a reference for reading the code data and having the predetermined number of consecutive bits of the predetermined value.

More specifically, to discriminate the marker as shown in FIG. 2 which serves as a reference for reading code data, from data dots, the modulating apparatus modulates input data to data of the bits less than the number of blacks constituting the marker. The modulating apparatus comprises a plurality of modulating units for converting data of the consecutive dots to consecutive data dots of the number less than the number of blacks of the marker. The amount of circuitry of the modulating units is reduced, so that a compact modulating apparatus can be manufactured at low cost. If the modulation is processed by software, the process speed can be increased.

(3) The modulating apparatus as described in the above paragraph (2), wherein the predetermined number of consecutive bits is 3 or more; and the n-number of modulating units include at least one of a modulating unit for converting input data of Pi=1 bit to data of Qi=2 bits, a modulating unit for converting input data of Pi=2 bits to data of Qi=3 bits, a modulating unit for converting input data of Pi=3 bits to data of Qi=4 bits and a modulating unit for converting input data of Pi=4 bits to data of Qi=5 bits.

As described above with reference to the table shown in FIG. 20, according to this modulating apparatus, the modulating condition is satisfied, the redundancy is less, and the amount of circuitry is less as shown in FIG. 14 or 18.

(4) The modulating apparatus as described in the above paragraph (2), wherein the code data has a number of blocks including at least data dots arranged in accordance with contents of the input data, and a marker, serving as a reference mark, which has a pattern different from that of the data dots and is arranged in a predetermined positional relationship with respect to the data dots.

As described above, since the code data is constructed as a group of blocks including at least data dots and the marker, the marker can be easily discriminated from data. In addition, since code data can be two-dimensionally exploded without limitation, this is advantageous in layout of records.

(5) The modulating apparatus as described in the above paragraph (2), wherein the modulating apparatus modulates the input data, so that the number of consecutive bits of the predetermined value in the code data is half the predetermined number of consecutive bits of the predetermined value in the reference mark.

With this apparatus, the number of consecutive bits of the predetermined value, i.e., "1" of adjacent unit blocks cannot exceed the number of consecutive bits of the value in the reference mark. Therefore, the reference mark can be discriminated from the code data more accurately.

(6) The modulating apparatus as described in the above paragraph (2), wherein the modulating apparatus modulates the input data one-dimensionally in a direction same as a scanning direction in which the code data is read by a reader.

If the data is modulated in a direction perpendicular to the scanning direction, the consecutive "1" bits appear in a portion other than the reference mark. Therefore, the above modulating apparatus is free from the drawback that the reference mark cannot easily be detected unless the scanning conversion has been completed.

(7) The modulating apparatus as described in the above paragraph (2), wherein the modulating apparatus modulates the input data two-dimensionally.

By the two-dimensional modulation, the direction of scanning is not limited, and the data can be scanned easily.

(8) A demodulating apparatus for converting input data of M bits to data of N bits (M>N+1: M and N are integers), comprises:
  means for dividing the input data of M bits to input data of an n-number (n≧2) of Qi bits (M=Q1+Q2+ . . . +Qn: Qi is an integer); and
  an n-number of demodulating units for converting the divided input data of Qi bit to data of Pi bits (N=P1+P2+ . . . +Pn: Pi is an integer: Qi≧Pi+1).

The M-N demodulating apparatus comprises a plurality of demodulating units, each converting part of bits of the input data to part of bits of the output data. The input bits and the output bits of one unit are independent of those of another unit. Therefore, the memory capacity or the amount of circuitry of each of the demodulating units is reduced, so that a compact demodulating apparatus can be manufactured at low cost.

(9) The demodulating apparatus as described in the above paragraph (8), wherein the input data of M bits is converted to data of N bits by a modulating system for modulating the input data, so that a number of consecutive bits of a predetermined value in a code data which can be read optically is less than a predetermined number of consecutive bits of the predetermined number in a reference mark, in order to discriminate the code data from the reference mark, the reference mark serving as a reference for reading the code data and having the predetermined number of consecutive bits of the predetermined value.

More specifically, to discriminate the marker as shown in FIG. 2 which serves as a reference for reading code data, from data dots, the demodulating apparatus modulates input data to data of the bits less than the number of blacks constituting the marker. The demodulating apparatus comprises a plurality of demodulating units for converting data of the consecutive dots to consecutive data dots of the number less than the number of blacks of the marker. The amount of circuitry of the demodulating units is reduced, so that a compact demodulating apparatus can be manufactured at low cost. If the demodulation is processed by software, the process speed can be increased.

(10) The demodulating apparatus as described in the above paragraph (9), wherein the predetermined number of consecutive bits is 3 or more; and the n-number of demodulating units include at least one of a demodulating unit for converting input data of Qi=2 bits to data of Pi=1 bit, a demodulating unit for converting input data of Qi=3 bits to data of Pi=2 bits, a demodulating unit for converting input data of Qi=4 bits to data of Pi=3 bits and a demodulating unit for converting input data of Qi=5 bits to data of Pi=4 bits.

As described above with reference to the table shown in FIG. 20, according to this demodulating apparatus, the modulating condition is satisfied, the redundancy is less, and the amount of circuitry is less as shown in FIG. 17 or 19.

(11) A modulating method for modulating input data in case of recording code data, which can be read optically, on a recording medium, so that a number of consecutive bits of a predetermined value in the code data is less than a predetermined number of consecutive bits of the predetermined value in a reference mark, in order to discriminate the code data from the reference mark, the reference mark serving as a reference for reading the code data and having the predetermined number of consecutive bits of the predetermined value.

The modulation method is particularly adapted for recording dot codes as disclosed in EP 0 670 555 A1, whereby the redundancy is reduced and the reference mark is easily discriminated from data.

(12) The modulating method as described in the above paragraph (11), wherein the code data has a number of blocks including at least data dots arranged in accordance with contents of the input data and a marker, serving as a reference mark, which has a pattern different from that of the data dots and is arranged in a predetermined positional relationship with respect to the data dots.

As described above, since the code data is constructed as a group of blocks including at least data dots and the marker, the marker can be easily discriminated from data. In addition, since code data can be two-dimensionally exploded without limitation, this is advantageous in layout of records.

(13) The modulating method as described in the above paragraph (11) or (12), wherein the input data is modulated, so that the number of consecutive bits of the predetermined value in the code data is half the predetermined number of consecutive bits of the predetermined number in the reference mark.

With this method, the number of consecutive bits of the predetermined value, i.e., "1" of adjacent unit blocks cannot exceed the number of consecutive bits of the reference mark. Therefore, the reference mark can be discriminated from data more accurately.

(14) The modulating method as described in the above paragraph (11) or (12), wherein the input data is modulated one-dimensionally in a direction same as a scanning direction in which the code data is read by a reader.

If the data is modulated in a direction perpendicular to the scanning direction, the consecutive "1" bits appear in a portion other than the reference mark. Therefore, the above modulating apparatus is free from the drawback that the reference mark cannot easily be detected unless the scanning conversion has been completed.

(15) The modulating method as described in the above paragraph (11) or (12), wherein the input data is modulated two-dimensionally.

By the two-dimensional modulation, the direction of scanning is not limited, and the data can be scanned easily.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. The modulating apparatus for converting input data of N bits to data of M bits, where M>(N+1) and M and N are integers, said modulating apparatus comprising:

means for dividing the input data of N bits to input data of an n-number of Pi bits, where $n \geq 2$, $N=P1+P2+ \ldots +Pn$, and Pi is an integer; and a plurality of modulating units, corresponding in number to the divided input data, for converting the divided input data of Pi bits to data of Qi bits, where $M=Q1+Q2+ \ldots =Qn$, Qi is an integer, and $Qi \geq (Pi+1)$;

wherein the input data is modulated in a case of recording optically readable code data on a recording medium so that a number of consecutive bits of a predetermined value in the code data is less than a predetermined number of consecutive bits of the predetermined value in a reference mark in order to discriminate the code data from the reference mark, said reference mark serving as a reference for reading the code data and having the predetermined number of consecutive bits of the predetermined value; and wherein the code data has a number of blocks including at least data dots arranged in accordance with contents of the input data, and a marker, serving as the reference mark, which has a pattern different from that of the data dots and which is arranged in a predetermined positional relationship with respect to the data dots.

2. A modulating method for modulating input data in a case of recording optically readable code data on a recording medium so that a number of consecutive bits of a predetermined value in the code data is less than a predetermined number of consecutive bits of the predetermined value in a reference mark in order to discriminate the code data from the reference mark, said reference mark serving as a reference for reading the code data and having the predetermined number of consecutive bits of the predetermined value;

wherein the code data has a number of blocks including at least data dots arranged in accordance with contents of the input data, and a marker, serving as the reference mark, which has a pattern different from that of the data dots and which is arranged in a predetermined positional relationship with respect to the data dots.

3. A modulating apparatus for modulating input data to code data which is optically readable and for recording the code data on a recording medium, said code data having a number of blocks including at least data dots arranged in accordance with contents of the input data, and a marker including a predetermined number of consecutive bits of a predetermined data value, said marker serving as a reference mark which has a pattern different from that of the data dots and said marker being arranged in a predetermined positional relationship with respect to the data dots; and said modulating apparatus comprising modulating means for modulating the input data so that a number of consecutive bits of only the predetermined data value of the data dots is less than the predetermined number of consecutive bits of the predetermined data value of the marker, in order to discriminate the code data from the marker.

4. The modulating apparatus according to claim 3, wherein said modulating means comprises means for modulating the input data so that the number of consecutive bits of only the predetermined data value of the data dots is at most half of the predetermined number of consecutive bits of the predetermined data value of the marker.

5. The modulating apparatus according to claim 3, wherein said modulating means comprises means for modulating the input data one-dimensionally in a same direction as a scanning direction in which the code data is read by a reader.

6. The modulating apparatus according to claim 3, wherein said modulating means comprises means for modulating the input data two-dimensionally.

7. The modulating apparatus according to claim 3, wherein said modulating means converts input data of N bits to data of M bits, where $M>(N+1)$ and M and N are integers, and said modulating means comprises:

means for dividing the input data of N bits to input data of an n-number of Pi bits, where $n \geq 2$, $N=P1+P2+ \ldots +Pn$, and Pi is an integer; and a plurality of modulating units, corresponding in number to the divided input data, for converting the divided input data of Pi bits to data of Qi bits, where $M=Q1+Q2+ \ldots Qn$, Qi is an integer, and $Qi \geq (Pi+1)$.

8. The modulating apparatus according to claim 7, wherein the predetermined number of consecutive bits is 3; and the plurality of modulating units include at least one of a modulating unit for converting input data of Pi=1 bit to data of Qi=2 bits, a modulating unit for converting input data of Pi=2 bits to data of Qi=3 bits, a modulating unit for converting input data of Pi=3 bits to data of Qi=4 bits, and a modulating unit for converting input data of Pi=4 bits to data of Qi=5 bits.

9. A demodulating apparatus for optically reading and demodulating modulated data recorded on a recording medium as code data which is optically readable, said code data having a number of blocks including at least data dots arranged in accordance with contents of the input data, and a marker including a predetermined number of consecutive bits of a predetermined data value, said marker serving as a reference mark which has a pattern different from that of the data dots and said marker being arranged in a predetermined positional relationship with respect to the data dots; and said demodulating apparatus comprising demodulating means for demodulating the input data by inputting data which is modulated so that a number of consecutive bits of only the predetermined data value of the data dots is less than the predetermined number of consecutive bits of the predetermined data value of the marker, in order to discriminate the code data from the marker.

10. The demodulating apparatus according to claim 9, wherein said demodulating means converts input data of M bits to data of N bits, where $M>(N+1)$ and M and N are integers, and said demodulating means comprises:

means for dividing the input data of M bits to input data of an n-number of Qi bits, where $n \geq 2$, $M=Q1+Q2+ \ldots +Qn$, and Qi is an integer; and a plurality of demodulating units, corresponding in number to the divided input data, for converting the divided input data of Qi bits to data of Pi bits, where $N=P1+P2+ \ldots +Pn$, Pi is an integer, and $Qi \geq (Pi+1)$.

11. The modulating apparatus according to claim 10, wherein the predetermined number of consecutive bits is 3; and the plurality of demodulating units include at least one of a demodulating unit for converting input data of Qi=2 bits to data of Pi=1 bit, a demodulating unit for converting input data of Qi=3 bits to data of Pi=2 bits, a demodulating unit for converting input data of Qi=4 bits to data of Pi=3 bits, and a demodulating unit for converting input data of Qi=5 bits to data of Pi=4 bits.

12. A modulating method for modulating input data to code data which is optically readable and for recording the code data on recording medium, said code data having a number of blocks including at least data dots arranged in accordance with contents of the input data, and a marker including a predetermined number of consecutive bits of a predetermined data value, said marker serving as a reference mark which has a pattern different from that of the data dots and said marker being arranged in a predetermined positional relationship with respect to the data dots; and said modulating method comprising the step of modulating the input data so that a number of consecutive bits of only the predetermined data value of the data dots is less than the predetermined number of consecutive bits of the predetermined data value of the marker, in order to discriminate the code data from the marker.

13. The modulating method according to claim 12, wherein said modulating method comprises the step of modulating the input data so that the number of consecutive bits of only the predetermined data value of the data dots is at most half the predetermined number of consecutive bits of the predetermined data value of the marker.

14. The modulating method according to claim 12, wherein said modulating method comprises the step of modulating the input data one-dimensionally in a same direction as a scanning direction in which the code data is read by a reader.

15. The modulating method according to claim 12, wherein said modulating method comprises the step of modulating the input data two-dimensionally.

* * * * *